United States Patent [19]

Miller

[11] Patent Number: 4,833,345
[45] Date of Patent: May 23, 1989

[54] SAMPLE/HOLD AMPLIFIER FOR INTEGRATED CIRCUITS

[75] Inventor: Gerald A. Miller, Hudson, N.H.

[73] Assignee: Analog Devices, Incorporated, Norwood, Mass.

[21] Appl. No.: 151,914

[22] Filed: Feb. 3, 1988

[51] Int. Cl.$^4$ ............................................. G11C 27/02
[52] U.S. Cl. ................................. 307/353; 307/491; 307/494
[58] Field of Search ............... 307/352, 353, 491, 494; 328/151

[56] References Cited

U.S. PATENT DOCUMENTS

| | | | |
|---|---|---|---|
| 3,516,002 | 6/1970 | Hillis | 307/353 |
| 4,302,689 | 11/1981 | Brodie | 307/353 |
| 4,352,070 | 9/1982 | Beauducel | 307/353 |

*Primary Examiner*—John Zazworsky
*Attorney, Agent, or Firm*—Parmelee, Bollinger & Bramblett

[57] ABSTRACT

A sample/hold amplifier comprising two transconductance stages with their inverting input terminals connected together. In sample mode, the input signal is connected to the non-inverting input of the first stage, and a hold capacitor is connected to the non-inverting input terminal of the second stage and driven by the amplifier output through a feedback circuit which forces the hold capacitor voltage to track the input signal. Upon switchover to hold mold, the roles of the two transconductance stages are interchanged: The non-inverting input terminal of the first stage is connected through a feedback circuit to the amplifier output, and the second stage receives as an input signal the voltage of the hold capacitor, which now is disconnected from the amplifier output. The net offset voltage developed on the hold capacitor is the difference between the respective offsets of the two transconductance stages. This net offset voltage is compensated for by an equal and opposite voltage in hold mode, due to the interchange of roles of the two transconductance stages.

13 Claims, 1 Drawing Sheet

SAMPLE AND HOLD AMPLIFIER
IN SAMPLE MODE

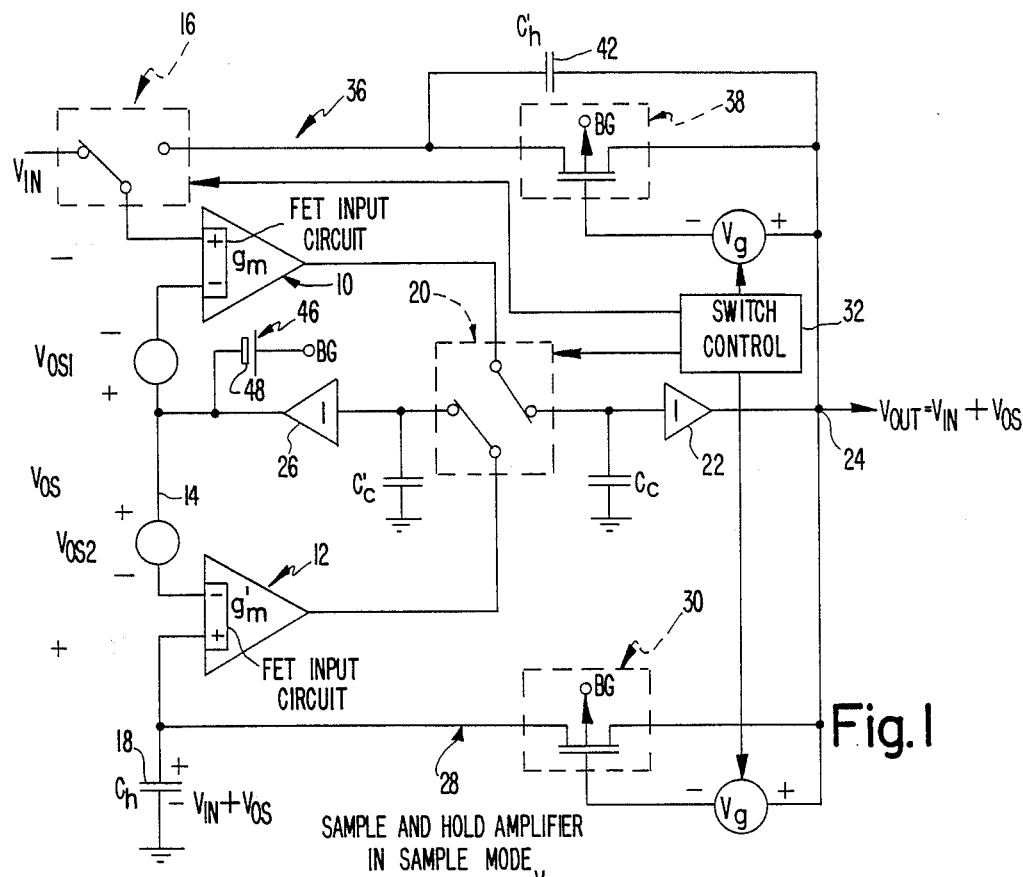
Fig. 1 SAMPLE AND HOLD AMPLIFIER IN SAMPLE MODE
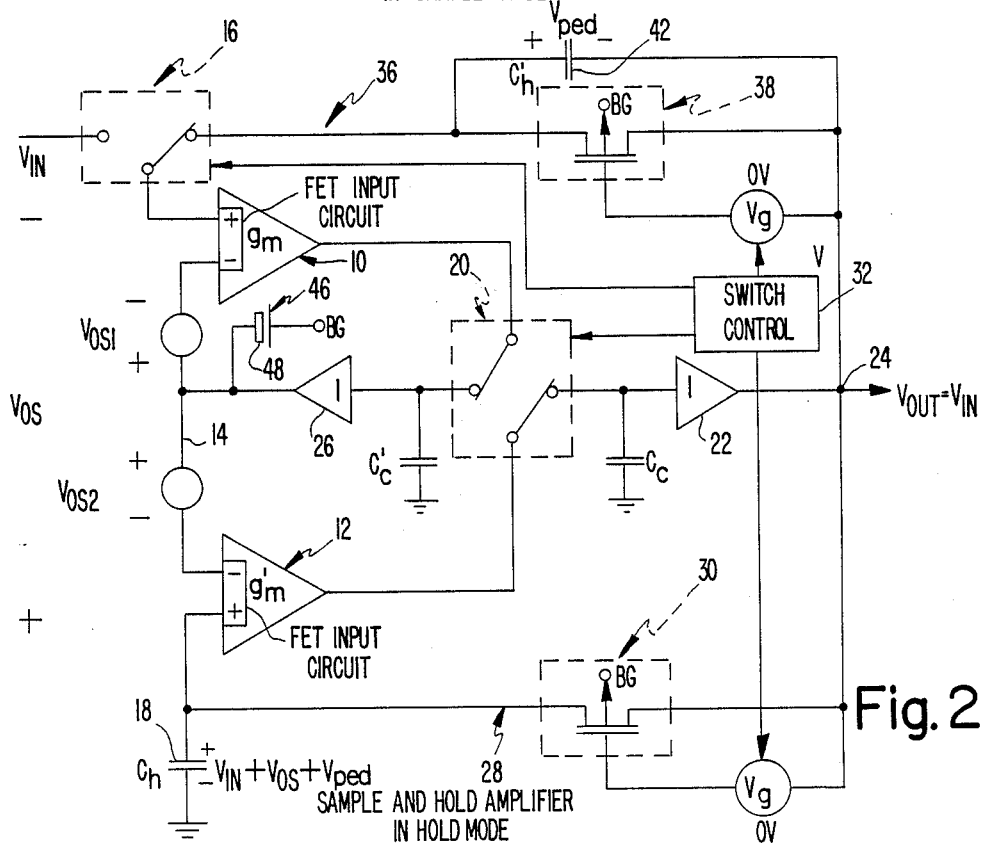
Fig. 2 SAMPLE AND HOLD AMPLIFIER IN HOLD MODE

SAMPLE/HOLD AMPLIFIER FOR INTEGRATED CIRCUITS

BACKGROUND OF THE INVENTION

1. Field of the Invention

This invention relates to sample/hold amplifiers which track an input signal during sample mode, and retain the last value of the input signal when switched to hold mode. More particularly, this invention relates to sample/hold amplifiers having auto-zero compensation to substantially reduce errors in the level of the signal retained in the hold mode.

2. Description of the Prior Art

Sample/hold amplifiers have been used for many years and particularly with data acquisition systems, e.g. to maintain constant the input signal to an A/D converter during the conversion interval. Many types of sample/hold amplifiers have been proposed, with special attention being directed to techniques for avoiding errors such as due to offset voltages in the amplifier circuitry. One recent example of such prior art is U.S. Pat. No. 4,587,443 wherein a pair of amplifiers are arranged in cascade, with the interconnection between the amplifiers being switched in a criss-cross fashion when transferring from sample to hold.

In general, prior art sample/hold apparatus has suffered from important deficiencies, including excessive errors for use with high-performance systems, and/or undue complexity with resultant high cost of manufacture. The present invention is directed to providing an improved sample/hold amplifier which has excellent performance capabilities together with circuit simplicity.

SUMMARY OF THE INVENTION

In a preferred embodiment of the invention, to be described hereinbelow in detail, the sample/hold amplifier comprises a pair of matched transconductance stages the inputs of which are interconnected in a series arrangement, in opposing polarity sense. In sample mode, the input signal is applied to the non-inverting input terminal of the first transconductance stage the output of which correspondingly drives the amplifier output circuit. The second transconductance stage is connected as a unity gain follower, and a hold capacitor is connected to its non-inverting input terminal. A feedback circuit from the amplifier output drives this capacitor so that its voltage follows the input signal.

The hold capacitor will, in addition to tracking the input signal, carry an error voltage component due to the offset voltages of the two transconductance stages. Since the inputs of the two transconductance stages are series-connected in reverse polarity sense, the resultant net offset voltage for the two stages together will be equal to the difference between the individual offsets of the respective stages. With the good component matching achievable in IC processing, the two transconductance stages will be very nearly identical, so the net offset will be very small.

Upon switching to hold mode, the roles of the two transconductance stages are interchanged: (1) The second transconductance stage now develops the amplifier output signal in accordance with the voltage applied to the input of that stage by the hold capacitor, (2) the first transconductance stage now is connected as a unity gain follower, rather than the second stage, and (3) a feedback circuit couples the amplifier output to the non-inverting input terminal of the first transconductance stage, rather than of the second stage. Since the roles of the transconductance stages are interchanged when the amplifier is switched from sample to hold mode, the small net offset voltage originally developed on the hold capacitor (during sample mode) will be compensated for by a substantially equal but opposite-polarity offset voltage produced by the interchanged circuitry when switched to hold mode.

Accordingly, it is an object of this invention to provide a sample/hold amplifier having superior capabilities and characteristics. A specific object of the invention is to provide a sample/hold amplifier having a very low offset voltage error component in its output signal. Another specific object of the invention is to provide a sample/hold amplifier having a very low switch pedestal voltage error component in its output signal. Other objects, aspects and advantages of the invention will in part be pointed out in, and in part apparent from, the following description of the presently preferred embodiment, considered together with the accompanying drawings.

BRIEF DESCRIPTION OF THE DRAWINGS

FIG. 1 is a diagram of a sample/hold amplifier in accordance with the invention, shown in sample mode; and FIG. 2 is a diagram like FIG. 1 but with the amplifier configured for hold mode.

DETAILED DESCRIPTION OF A PREFERRED EMBODIMENT

Referring now to FIG. 1, there is shown a sample/hold amplifier (SHA) circuit to be fabricated in IC format on a monolithic chip. Typically, the circuit is formed on the chip together with other associated circuitry, such as an analog-to-digital converter (see, for example, copending U.S. application Ser. No. 106,712 filed by the present inventor and others).

The SHA of FIG. 1 comprises a pair of matched transconductance stages 10, 12 with FET inputs which are series-connected by a connection 14 between the respective inverting input terminals, i.e. the inputs are interconnected in reverse-polarity sense. The SHA input signal $V_{in}$ is connected through an input switch 16 to the non-inverting input of the upper stage 10. A hold capacitor 18 is connected to the non-inverting input terminal of the lower stage 12, and also to circuit common.

The gain of the transconductance stages 10, 12 may for example be about 1000. The amplified outputs of both stages are connected to respective terminals of a double-pole switching means 20 the functioning of which will be explained hereinbelow.

When the SHA is in its sample mode, as shown in FIG. 1, the output of the first transconductance stage 10 is connected through the switching means 20 and a unity gain buffer 22 to the output terminal 24 of the SHA. The output of the second transconductance stage 12 is connected through the switching means 20 and a second unit gain buffer 26 to the common connection 14 between the inverting inputs of the stages 10, 12, thus connecting the second stage 12 as a unity gain follower. The output of the SHA at terminal 24 is connected through a negative feedback circuit 28, including an FET switch 30 (closed in sample mode), to the non-inverting input terminal of the lower transconductance stage 12. This is the input terminal to which the hold capacitor also is connected, so that the capacitor is driven by feedback from the amplifier output circuit.

With the SHA conditioned in sample mode as described above, the voltage developed at the hold capacitor 18 will be equal to the input voltage $V_{IN}$, plus an error voltage component resulting from the offset voltages (shown as $V_{OS1}$ and $V_{OS2}$) of the two transconductance stages 10, 12. Because the inputs of these two stages are series-connected in reverse-polarity sense, the net offset voltage component ($V_{OS}$) at the hold capacitor will be equal to the difference between the individual offsets, i.e. $V_{OS1} - V_{OS2}$. Since with IC processing, matched elements are very nearly identical, the individual offsets of stages 10 and 12 will be very nearly identical, and therefore the difference in offsets ($V_{OS}$) will be quite small in absolute terms.

Switching the SHA from sample to hold mode (or the reverse) is effected by a switch control generally indicated at 32, and which may be of conventional design for controlling all of the switches of the sample/hold amplifier. In transferring from sample to hold, the amplifier circuitry is reconfigured to that shown in FIG. 2, by means of a sequenced operation of the switches. In making this changeover, the first step is to open the FET switch 30 (called the hold switch) by changing the gate voltage $V_g$ from a negative voltage to zero. With this switch open, the voltage of the hold capacitor 18 no longer is affected by the amplifier output. In this reconfiguration, the lower transconductance stage 12 receives the voltage of the hold capacitor 18 as an input signal on the non-inverting input terminal of that stage.

Next in sequence, the input switch 16 is operated to disconnect the SHA from the input signal $V_{in}$, and to connect the non-inverting input terminal of the upper transconductance stage 10 through a negative feedback circuit 36 (including an initially-closed FET switch 38) to the SHA output terminal 24. Then the switching means 20 is operated to its hold state (FIG. 2), with the output of the lower transconductance stage 12 directed to the SHA output terminal 24, and the output of the upper transconductance stage directed to the common connection 14 between the input circuits of the two stages.

With the SHA circuitry reconfigured into hold mode, as described above, it will be seen that the roles of the transconductance stages 10, 12 have been effectively interchanged. That is, the lower transconductance stage now receives a signal (from the hold capacitor 18) to be reproduced at the SHA output, and the upper transconductance stage (rather than the lower stage) now is connected as a unity gain follower to operate as part of a feedback arrangement to match the output and input. Because of this role interchange, the small offset voltage ($V_{OS}$) previously developed on the hold capacitor will be countered by a corresponding offset voltage of opposite polarity ($-V_{OS}$) so that the offset voltage will be eliminated (at least substantially) from the final output voltage $V_{out}$ at the output terminal 24.

One additional potential error in the FIG. 2 circuit results from opening of the FET switch 30 during switchover to hold mode, for the purpose of disconnecting the hold capacitor 18 from the amplifier output terminal 24. When this switch opens, charge will pass into the parasitic capacitances associated with the source and drain of the FET so as to develop in the hold capacitor an additional error voltage component, referred to as the pedestal voltage ($V_{ped}$). To avoid error in the final output signal due to this pedestal voltage, the sample/hold amplifier of FIGS. 1 and 2 incorporates the additional FET switch 38, matching the FET hold switch 30. A capacitor 42 is connected across the additional FET switch 38.

At switchover to hold mode, the FET switch 38 is initially closed. After a short period of time, sufficient to operate all of the other switches to hold mode and to allow the voltages and currents of the circuitry to settle out, this switch 38 is opened by the switch control 32. The capacitor 42 thereupon is inserted in series with the feedback circuit 36. Due to the flow of charges into the parasitic capacitances associated with the source and drain of the FET switch 38 (just as previously in the FET switch 30), this capacitor 42 develops a compensating voltage corresponding to the pedestal voltage $V_{ped}$ already developed on the hold capacitor 18. This compensating voltage is in the negative feedback circuit 36 of the amplifier, and nullifies (at least substantially) the effect of the pedestal voltage on the output signal $V_{out}$ at the output terminal 24, so that $V_{out}$ is made substantially equal to $V_{in}$.

In accordance with another aspect of the present disclosure, the back gates (BG) of the FET switches 30 and 38 are energized by a circuit 46 which is tied to the common connection 14 between the inputs to the transconductance stages 10, 12. This circuit includes a source of positive bias of about 600 millivolts, illustrated as a battery 48, but which in practice would be a more conventional arrangement such as a biased diode. By connecting the back gate circuit 46 to the inverting input terminals, the back gates will be supplied with a potential which varies with the applied input signal, thereby minimizing variation of the threshold voltages with the input signal level as they might with a fixed back gate voltage. This arrangement also assures proper buffering for the back gate voltages, without the need for additional buffer circuitry.

Although a specific preferred embodiment of the invention has been described hereinabove in detail, it is to be understood that this is for the purpose of providing an illustrative example of the invention and is not to be construed as necessarily limitative, since it is apparent that those skilled in this art can make many modifications as required for specific applications without departing from the scope of the invention.

What is claimed is:

1. An IC sample/hold amplifier (SHA) having an input circuit and an output circuit developing an output signal, said SHA comprising:

first and second gain stages each having an input circuit and a pair of input terminals;

first switch means connected to one input terminal of said first gain stage and operable into alternative states to connect that input terminal either to (1) said input circuit, to receive the input signal, or (2) a feedback circuit for said amplifier, to provide said one input terminal with a signal corresponding to the amplifier output signal;

means establishing a common connection between the other input terminal of said first gain stage and one input terminal of said second gain stage;

second switch means operable into alternative states wherein either (1) the output of said first gain stage is connected to said amplifier output circuit and the output of said second gain stage is connected to said common connection, or (2) the output of said second gain stage is connected to said amplifier output circuit and the output of said first gain stage is connected to said common connection;

a hold capacitor connected to said other input terminal of said second gain stage;

third switch means operable into alternative states wherein (1) said other input terminal of said second gain stage is connected to said amplifier output circuit, or (2) said other input terminal of said second gain stage is disconnected from said amplifier output circuit; and control means for operating said switch means between said states to transfer said amplifier between sample mode and hold mode.

2. A SHA as in claim 1, wherein said gain stages are transconductance stages.

3. A SHA as in claim 1, wherein said gain stages input terminals are non-inverting and inverting respectively, said common connection being between input terminals of like character.

4. A SHA as in claim 3, wherein said common connection provides a connection between the inverting terminals of said first and second gain stages.

5. A SHA as in claim 1, wherein in sample mode all of said switch means are in state (1), and in hold mode all of said switch means are in state (2).

6. A SHA as in claim 5, wherein in transferring from sample to hold mode, said control means operates said switch means in the predetermined sequence of: (a) said third switch means, (b) said first switch means, and (c) said second switch means.

7. A SHA as in claim 1, wherein the input circuits of both of said gain stages comprise FET devices.

8. A SHA as in claim 1, wherein said third switch means comprises an FET device.

9. A SHA as in claim 8, including fourth FET switch means in series with said amplifier feedback circuit and operable from closed to open state by said control means after the operation of said third, first and second switch means into state (2); and a capacitor connected to said fourth switch means to produce a voltage to compensate for the pedestal voltage produced by operation of said third switch means.

10. A SHA as in claim 8, including a back gate energizing circuit for said FET device, said energizing circuit including means for producing a back gate voltage which varies with said input signal.

11. A SHA as in claim 10, including fourth switch means comprising an FET device in series with said amplifier feedback circuit;

a capacitor connected to said fourth switch means to produce a pedestal compensation voltage;

the back gate of said fourth switch means device being supplied with a signal from said back gate energizing circuit.

12. A SHA as in claim 11, wherein said back gate energizing circuit is connected to said common connection to receive a voltage corresponding to said input signal.

13. A SHA as in claim 1, including a first buffer stage between said second switch means and said output circuit; and a second buffer stage between said second switch means and said common connection between said input terminals of said gain stages.

* * * * *